United States Patent
Oldsen et al.

(10) Patent No.: US 8,201,452 B2
(45) Date of Patent: Jun. 19, 2012

(54) HOUSING FOR MICRO-MECHANICAL AND MICRO-OPTICAL COMPONENTS USED IN MOBILE APPLICATIONS

(75) Inventors: Marten Oldsen, Hamburg (DE); Ulrich Hofmann, Itzehoe (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 396 days.

(21) Appl. No.: 12/448,911

(22) PCT Filed: Jan. 17, 2008

(86) PCT No.: PCT/EP2008/000321
§ 371 (c)(1),
(2), (4) Date: Jul. 15, 2009

(87) PCT Pub. No.: WO2008/087022
PCT Pub. Date: Jul. 24, 2008

(65) Prior Publication Data
US 2010/0061073 A1 Mar. 11, 2010

(30) Foreign Application Priority Data
Jan. 18, 2007 (DE) .......................... 10 2007 002 725

(51) Int. Cl.
*G01P 15/08* (2006.01)

(52) U.S. Cl. .................................................. 73/514.26
(58) Field of Classification Search .................. None
See application file for complete search history.

(56) References Cited

U.S. PATENT DOCUMENTS

| 5,591,679 | A | 1/1997 | Jakobsen et al. |
| 6,146,917 | A | 11/2000 | Zhang et al. |
| 6,316,796 | B1 * | 11/2001 | Petersen et al. ............... 257/254 |
| 6,743,656 | B2 | 6/2004 | Orcutt et al. |
| 6,958,846 | B2 | 10/2005 | Huibers et al. |
| 2002/0178817 | A1 | 12/2002 | Selvakumar et al. |
| 2004/0025589 | A1 * | 2/2004 | Kurle et al. ...................... 73/488 |
| 2004/0132893 | A1 * | 7/2004 | Malone et al. .................. 524/500 |
| 2005/0184304 | A1 | 8/2005 | Gupta et al. |
| 2005/0239228 | A1 | 10/2005 | Quenzer et al. |
| 2006/0110893 | A1 * | 5/2006 | Quenzer et al. ............... 438/455 |
| 2006/0130584 | A1 * | 6/2006 | Ono et al. .................. 73/514.36 |
| 2006/0144143 | A1 | 7/2006 | Gogoi et al. |
| 2006/0272413 | A1 | 12/2006 | Vaganov et al. |

FOREIGN PATENT DOCUMENTS

| DE | 102007002725 A1 | 7/2008 |
| WO | WO 01/04680 A1 | 1/2001 |
| WO | WO 2004/068665 A2 | 8/2004 |

* cited by examiner

Primary Examiner — Robert R Raevis
(74) Attorney, Agent, or Firm — Jacobson Holman PLLC

(57) ABSTRACT

The present invention relates to a housing for one or more micromechanical and/or micro-optic components, wherein the housing exhibits a supporting substrate having at least one micromechanical and/or micro-optic component and at least one cap substrate, which is joined to the supporting substrate. The supporting substrate and the at least one cap substrate form at least one cavity, which at least partially encloses the at least one micromechanical and/or micro-optic component, wherein the side of at least one cap substrate facing the at least one micromechanical and/or micro-optic component exhibits at least one optical window and at least one mechanical stop. Furthermore, the object of the present invention is a method for producing such a housing, wherein the method is particularly usable for encapsulation at the wafer level.

13 Claims, 3 Drawing Sheets

Figure 1:
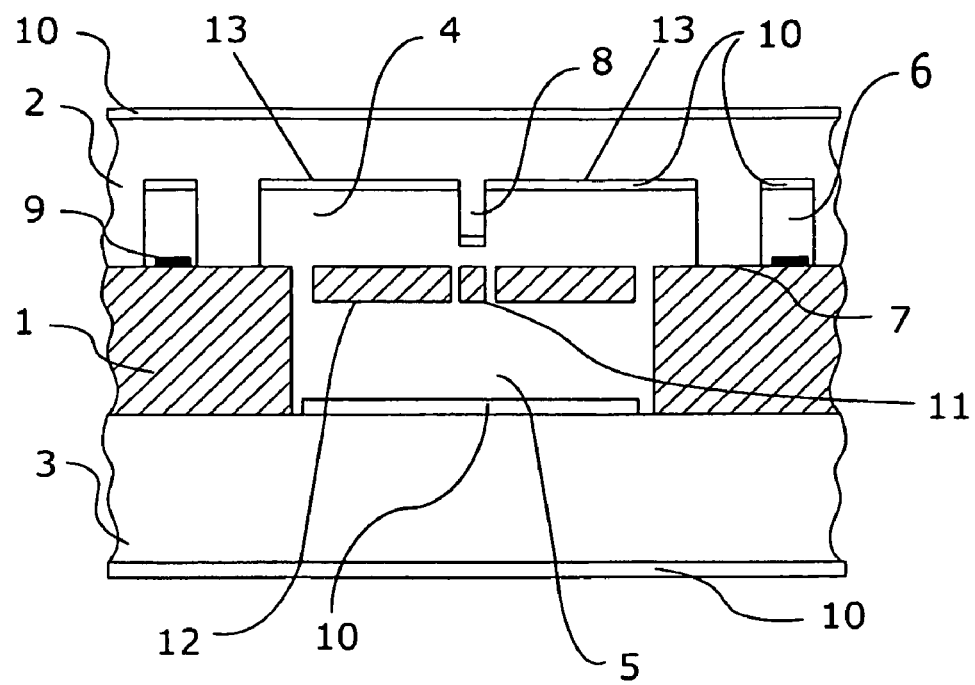

HOUSING FOR MICRO-MECHANICAL AND MICRO-OPTICAL COMPONENTS USED IN MOBILE APPLICATIONS

This is a national stage of PCT/EP08/000321 filed Jan. 17, 2008 and published in German, which has a priority of German no. 10 2007 002 725.9 filed Jan. 18, 2007, hereby incorporated by reference.

FIELD OF THE INVENTION

Fully processed micromechanical (MEMS) and micro-optic (MOEMS) systems and components such as acceleration sensors, rotational speed sensors, and micromirrors generally consist of very sensitive microstructures that are sometimes freely moving (e.g. bars, gratings, plates). During most production steps necessary for manufacture (e.g. film deposition, photolithography, etching) the moving microstructures themselves are fastened to the substrate (supporting substrate), usually a wafer (supporting wafer), thereby becoming immobile. These microstructures do not become freely moving until a release process takes place. At that point, the moving microstructures are particularly sensitive, so contaminants or mechanical overload can cause the destruction or functional impairment of these microstructures, which in turn can cause the component to malfunction. For example, when a wafer is diced, i.e. the wafer is sawed into individual chips, the wafer surface and by extension the microstructures of the MEMS/MOEMS come into contact with particles and water. Furthermore, the microstructures can be exposed to relatively strong mechanical loads during sawing.

To be able to economically produce MEMS/MOEMS at a high rate of output, therefore, it is important to carry out the release process and to take steps particularly to protect the moving microstructures before the substrate is diced or separated.

The present invention relates to a housing for encapsulating micromechanical and micro-optic components, which are used particularly in mobile devices, and to a method for producing such a housing wherein the method is also suitable for encapsulating the MEMS/MOEMS at the substrate level, particularly at the wafer level, i.e. before dicing and therefore before the substrate is separated.

PRIOR ART

Housings for encapsulating MEMS/MOEMS and methods for producing such housings particularly at the wafer level, so-called wafer level packaging methods, are known from the semiconductor industry.

As described for example in U.S. Pat. No. 6,743,656, the wafer (supporting wafer) with the MEMS/MOEMS is joined to another wafer (cap wafer) that has recesses of defined dimensions. The wafers are generally silicon wafers, so the recesses in the cap wafer can be easily and precisely produced using the proven methods of silicon technology. In the subsequent dicing process, usually a sawing process, separately encapsulated chips are then created without the risk that the MEMS/MOEMS will be contaminated.

If the MEMS/MOEMS perform an optical function or if certain parameters or physical quantities of the MEMS/MOEMS are optically measured—for example, determining displacement by means of interferometers or by evaluating video sequences—then an optically transparent cap substrate is generally necessary.

In WO 2004/1068665, a wafer level packaging method is described for MOEMS that provides for a glass cap substrate. The wafer along with the MOEMS is diced, however, before the encapsulation process. The resulting separate unencapsulated chips (dies) are positioned, mounted, bonded and only then encapsulated on a new substrate.

In U.S. Pat. No. 6,146,917, a wafer level packaging method for MEMS/MOEMS is described in which a recessed silicon or glass cap wafer is joined to the supporting wafer by means of fusion or anodic bonding, resulting in a hermetically sealed housing. It is possible to produce the required 50 to 150 µm recesses in the silicon cap wafer by wet etching using a KOH solution, and this technique is transferable to glass wafers as well.

In US 2005/0184304, a wafer level packaging method is presented for the encapsulation of micromechanical surface fabricated micromirror arrays. A glass cap wafer has recesses serving as optical windows and having anti-reflective coatings. The recesses in the cap wafer can be deeper than 100 µm.

U.S. Pat. No. 5,591,679 shows a method for producing a hermetically sealed housing for MEMS/MOEMS that are fabricated with both surface and volume micromechanical process steps. In the case of surface micromechanical MEMS/MOEMS, a glass recessed cap wafer, which is anodically bonded to the silicon supporting wafer, is sufficient. For MEMS/MOEMS fabricated with volume micromechanical process steps, a second cap wafer for the second side of the supporting wafer opposite the first side of the supporting wafer is provided in addition to the first cap wafer on the first side of the supporting wafer. By setting a defined distance between supporting wafer and second cap wafer, the second cap wafer can serve as a mechanical stop against mechanical overload.

DESCRIPTION

It is the problem of the present invention to overcome the disadvantages of the prior art and to provide a housing that is particularly well-suited for optical applications, that exhibits mechanical protection against overloading and that can be produced on the substrate or wafer level. According to the present invention the problem is solved by the housing and method for producing the housing according to the claims of the present invention.

The housing according to the present invention serves to encapsulate one or more micromechanical and/or micro-optic component(s) and exhibits a supporting substrate having at least one micromechanical and/or micro-optical component, and at least one cap substrate. The supporting substrate and the cap substrate are joined, preferably by adhesive force, and form one or more cavities that at least partly includes at least one micromechanical and/or micro-optic component. The side of the cap substrate facing at least one micromechanical and/or micro-optic component exhibits at least one optical window and at least one mechanical stop.

A housing for encapsulating MEMS/MOEMS, particularly moving MEMS/MOEMS, generally ought to offer at least one form of protection against contaminants and at the same time not impair the mechanical and/or optical functionality of the MEMS/MOEMS. For example, a cap substrate can function as a housing that is joined to the supporting substrate. If the functionality of the MEMS/MOEMS is not only limited to motions at the supporting substrate level or parallel to the supporting substrate level but also to motions perpendicular to the supporting substrate, then the housing must afford the MEMS/MOEMS the proper freedom of movement.

For example, the cap substrate can exhibit recesses that form cavities around the MEMS/MOEMS in connection with the supporting substrate so that the functionality of the MEMS/MOEMS is not impaired.

To produce MEMS/MOEMS with soft suspensions and low resonance frequencies that are very sensitive to vibration and shock at a high rate of output, stops are necessary that protect against mechanical overload (for example, shock, vibrations, etc.), which can occur for example in mobile applications (for example in mobile phones).

While lateral forces that act at the substrate level can be provided and accordingly implemented through lateral stops in the MEMS/MOEMS design, additional vertical stops are necessary for forces acting perpendicularly from the substrate level.

The housing according to the present invention exhibits one or more integrated mechanical stops that preferably protrude(s) at any given point from the cap substrate in the direction of the MEMS/MOEMS.

As a result of the stops protruding particularly from the surface of the optical windows facing the MEMS/MOEMS, areas of the MEMS/MOEMS with the greatest displacement amplitudes—and by extension for example with rotational motions at maximum speed—can be prevented from striking the cap substrate. Along with the option to freely position the stops, there is also the possibility of providing areas of the MEMS/MOEMS for contact with the stops that are best suited for this; for example because their maximum vertical speed is low in comparison to other areas, because they do not perform any active function or constitute any active areas, as the case may be, and/or because these areas are mechanically designed to be particularly stable.

This reduces the risk of damage to the microstructures and the MEMS/MOEMS in the case of mechanical overload.

In principle the mechanical stops should not limit the functionality or the desired operating range of the MEMS/MOEMS, whereby the distance between the mechanical stops and the areas of the MEMS/MOEMS provided for contact with the stops would preferably be as short as possible.

In the case of many applications, the housing must also fulfill optical functions. As a result of the protruding stops, the housing according to the present invention is advantageous in that the MEMS/MOEMS contacts only the stops in the event of mechanical overloading. Other areas of the cap substrate do not touch the MEMS/MOEMS.

Consequently, the other areas of the cap substrate, which function as optical windows for example, are not damaged or impaired in their functionality.

According to the present invention, an optical window refers to an area of the housing that is permeable, in particular transparent, for any wavelengths and/or wavelength ranges of electromagnetic radiation—in particular the radiation to be processed by the MEMS/MOEMS to be encapsulated and the radiation used in the application—from the infrared, visible (light) and ultraviolet frequency range and that also usually meets strict quality requirements in particular with respect to surface roughness, evenness and plane parallelism. Furthermore, these areas should preferably exhibit a homogenous material structure.

A typical micro-optic component is the micromirror, which can be used for example in video laser projection as a scan mirror to deflect an incident laser beam. The laser beam in this case is to be dispersed and deformed by the housing as little as possible.

To create cavities between supporting substrate and cap substrate, recesses are created in the cap substrate for example, so supporting substrate and cap substrate as a rule completely enclose the MEMS/MOEMS after being joined.

In the case of most applications, depths between approximately 50 µm and 900 µm are sufficient for the recesses. To provide adequate displacement freedom for larger MEMS/MOEMS, recesses in the cap substrate deeper than 900 µm are advantageous.

Such recesses for example are useful for relatively large moving suspended micromirrors that can have a diameter of 10 mm. Tilting a micromirror of this size by 10° at its central axis results in a maximum displacement of nearly 870 µm from the substrate level.

It is particularly advantageous when the housing hermetically seals off the MEMS/MOEMS from the surrounding area so that a specific atmosphere can be set in the housing. This provides particularly good protection against contaminants while minimizing the risk of malfunction in the encapsulated MEMS/MOEMS. In addition, an atmosphere can be set in the cavities that is independent from the surrounding area.

While in the case of MEMS/MOEMS that are manufactured with surface micromechanical process steps a hermetically sealed encapsulation is already achievable by combining supporting substrate and a cap substrate, in the case of MEMS/MOEMS that are manufactured with volume micromechanical process steps and that partly possess microstructures completely etched through the supporting substrate at least a second cap substrate is necessary which is joined to the second side of the supporting substrate opposite the first side of the supporting substrate, which is joined to the first cap substrate, so that the supporting substrate has cap substrates on both sides.

In many applications the housing's internal pressure is preferably lower than the atmospheric pressure. For MEMS/MOEMS an internal housing pressure between approximately $10^{-3}$ mbar and approximately 1 mbar is preferred. This reduces attenuation for example particularly in systems that are operated upon resonance, which allows for higher quality factors and greater displacement amplitudes.

In the case of other applications it is advantageous when the cavities are filled with a gas to specifically influence certain properties of the MEMS/MOEMS. Eligible gases are dry and do not conduct electricity, do not chemically react with the materials used for the housing and the MEMS/MOEMS, and exhibit the required transparence; inert gases such as noble gases, nitrogen or $SF_6$ are cited as examples.

For example, in the case of applications for which heat is to be dissipated as quickly as possible onto the housing and into the surrounding area, argon is used as the atmospheric gas for the housing because argon does not conduct electricity although it does have a relatively high thermal conductivity. In addition, the diffusion tendency of argon is so low that the pressure ratios in the housing can be stable for a long time.

Silicon wafers are preferred as supporting substrates because the processes of silicon technology are well developed and easily controlled.

Particularly for moving MEMS/MOEMS that are used in optical applications a housing is needed that meets the aforementioned requirements for an optical window at least in partial areas and that does not impair or only minimally impairs the optical and mechanical functionality of the encapsulated MEMS/MOEMS.

It is therefore advantageous when the differences between the thermal expansion coefficients of supporting substrate and cap substrate are minimized or a layer is positioned between the two substrates by which the differing expansion coefficients can be balanced out.

This allows thermally induced mechanical stress between supporting substrate and cap substrate to be minimized and the risk of damage to the housing and the encapsulated MEMS/MOEMS to be reduced.

The cap substrate contains or preferably consists of glass and/or a glass-like material. According to the present invention, glass-like materials are understood to mean materials that are similar to glass in terms of their thermodynamic properties (amorphous structure, glass transition temperature) although their chemical composition is different from that of silicate glass. Examples of this are glassy polymers or organic vitroids familiar in the chemical industry such as polymethylmethacrylate (PMMA), polycarbonate and polystyrene.

Particularly well-suited glasses are silicate glasses, particularly borosilicate glasses because borosilicate glasses are extremely chemical and temperature-resistant. The temperature resistance and stability of borosilicate glasses against sudden temperature fluctuations are a result of their low thermal expansion coefficient. In addition, transmittance particularly in the visible range is very high at over 90%.

To satisfy optical quality demands, the optical windows of the housing should exhibit an evenness and/or plane parallelism deviation of less than one-fourth of the wavelength of the electromagnetic radiation used in the application, wavelengths from the ultraviolet range to the infrared range (for example, between approximately 200 nm and approximately 15 µm) usually being used. Accordingly, in the case of longer-waved light with wavelengths less than 720 nm it is advantageous for the evenness and/or plane parallelism deviation to be less than 180 nm. When shorter-waved light with wavelengths under 440 nm is used, the requirements on the optical windows increase so that it is preferable for the evenness and/or plane parallelism deviation to be less than 110 nm.

Optical windows that meet these requirements cause lower deviations and less beam expansion in the optical beam path, which results in less distortion of the optical signals.

In addition, the root-mean-square roughness of the optical windows should be as low as possible, preferably less than 15 nm, in particular preferably less than 5 nm. This reduces in particular the dispersion caused by the cap substrate.

The values for the evenness and plane parallelism deviation and for the root-mean-square roughness were determined using interferometric measurement methods. The MicroMap 512, a white light and phase interferometer manufactured by Atos, was used for the measurements.

To further optimize the properties of the optical windows it is advantageous to give these areas finishing coats at least partially.

Frequently used finishing coats are for example anti-reflective coats that reduce reflections on the optical windows, which in turn reduces radiation losses. Such anti-reflective coats can be implemented for example using coating systems made of magnesium fluoride and titanium oxide or silicon dioxide and titanium dioxide.

Furthermore, anti-static coats, which minimize the electrical charge of the cap substrate, are frequently used. A particularly well-suited material for anti-static coats and optical applications is ITO (indium-tin-oxide) because through doping it exhibits a high level of electrical conductivity and is highly transparent across a wide frequency range.

Furthermore, reflective coats, for example metal coats, can be applied that form locally reflecting areas after being patterned to create spatial limits for example around an incident light beam (aperture function) or to form a static deflection mirror in the vicinity of the optical windows.

Furthermore, preferable finishing coats are absorber coats, which absorb the electromagnetic radiation of specific wavelengths or entire wavelength ranges.

The method according to the present invention for producing a housing to encapsulate micromechanical and/or micro-optic components exhibits the following steps:
provision of a supporting substrate having at least one micromechanical and/or micro-optic component
provision of at least one cap substrate, which exhibits at least one optical window and at least one mechanical stop
joining of the supporting substrate to the at least one cap substrate so that the supporting substrate and the at least one cap substrate form at least one cavity that encloses at least one micromechanical and/or micro-optic component at least partially.

The method according to the present invention serves to encapsulate MEMS/MOEMS, which are usually applied or arranged on a supporting substrate. Usually a silicon wafer is used as supporting substrate on which the MEMS/MOEMS to be encapsulated are created through surface micromechanical or volume micromechanical process steps.

Furthermore, a cap substrate is necessary for encapsulation that is permeable usually before the creation of the optical windows and the mechanical stop at least in partial areas, but generally as a whole, for the electromagnetic radiation used in the application. For most optical applications, however, it is necessary for such permeable areas for the electromagnetic radiation used in the application to be as transparent as possible so that for example a laser beam will reach the MEMS/MOEMS with as little influence as possible.

To satisfy these requirements, the cap substrate is usually patterned. Recesses for the cavities, optical windows and the mechanical stops are created for this purpose.

As explained above, different glasses and certain glass-like synthetics are suitable. Different patterning methods used in silicon technology can also be used for glass substrates. For example the recesses could be etched with an HF solution. However, wet etching for patterning glass substrates generally results in considerable non-homogeneity with respect to the etching depths within the etched surfaces (inadequate plane parallelism) and, moreover, in heavily roughened surfaces, which is even more pronounced the deeper the etching. Generally such a patterned cap substrate is not suitable for optical purposes.

To obtain optical surfaces of high-quality, for the patterning of the cap substrate a glass flow method for example is useful in which the structures of a patterned substrate are molded for example on a glass substrate. The surface quality of the glass substrate is primarily determined here by the surface quality of the patterned substrate.

In an advantageous embodiment, after the cap substrate is patterned, in particular the optical windows are at least partially given an anti-reflective coat and/or an anti-static coat and/or a reflective coat and/or an absorber coat, the optical functionality of the housing thereby being improved.

In another process step the supporting substrate and the at least one cap substrate are joined so that the supporting substrate and the at least one cap substrate form at least one cavity that at least partially encloses the MEMS/MOEMS.

Generally all useful joining techniques are employable such as adhesion, soldering or bonding.

In a preferred embodiment, the supporting substrate and the at least one cap substrate are joined by anodical and/or eutectic bonding and/or glass frit bonding. Especially in the semiconductor industry these bonding methods are frequent joining techniques particularly for the hermetically sealed encapsulation of components. Eutectic bonding is particularly preferred when energy absorbed from the MEMS/MOEMS, for example radiation energy, is to be transferred to the cap substrate.

Depending on the environment in which the bonding process of the cap substrate or the cap substrates is carried out, a very specific atmosphere—for example a pressure lower than the atmospheric pressure, particularly preferred between approximately $10^{-3}$ mbar and 1 mbar and/or an inert gas filling, for example argon—can be created in a hermetically sealed housing. Therefore, joining techniques are preferred that can guarantee a stable atmosphere in the housing The method according to the present invention can be in particular preferably used on the wafer level as a wafer level packaging method, it being possible to encapsulate multiple MEMS/MOEMS at the same time, thereby constituting a time-saving and effective encapsulation method.

The method for encapsulating moving micromirrors and/or micromirror arrays is preferably used.

EXAMPLES

Without loss of generality, the invention is further described below by means of drawings and an embodiment.

FIG. 1 shows a micromirror 12, which is suspended by torsion springs 11, which micromirror, produced by volume micromechanical process steps, is encapsulated by two transparent cap wafers 2, 3.

Figure 2:
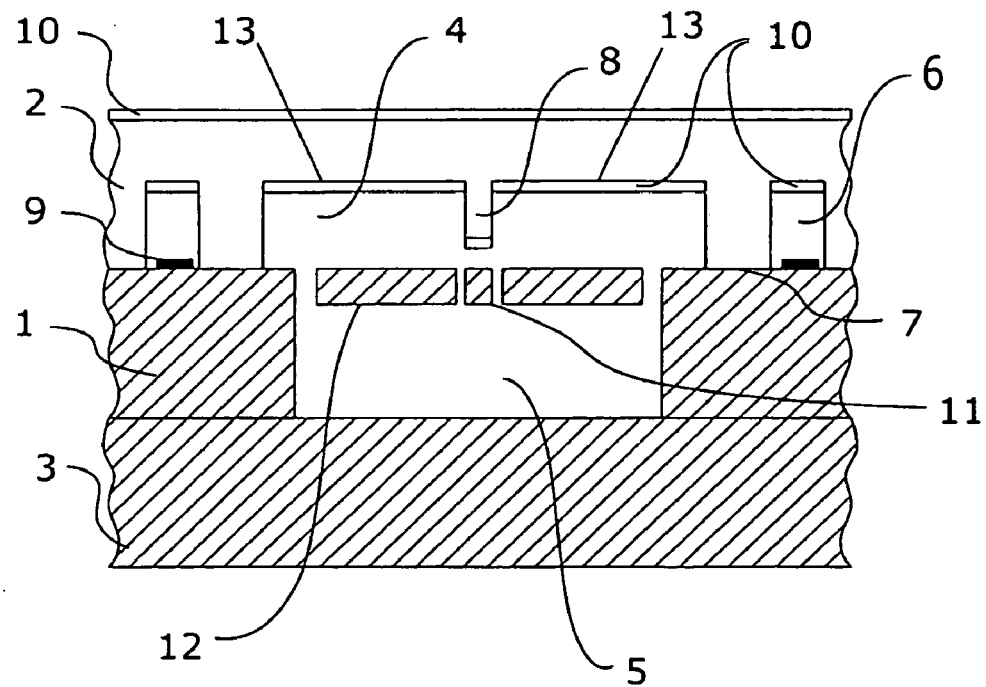

FIG. 2 shows a micromirror 12, which is suspended by torsion springs 11, which micromirror, produced by volume micromechanical process steps, is encapsulated by a transparent cap wafer 2 and a non-transparent even cap wafer 3.

Figure 3:
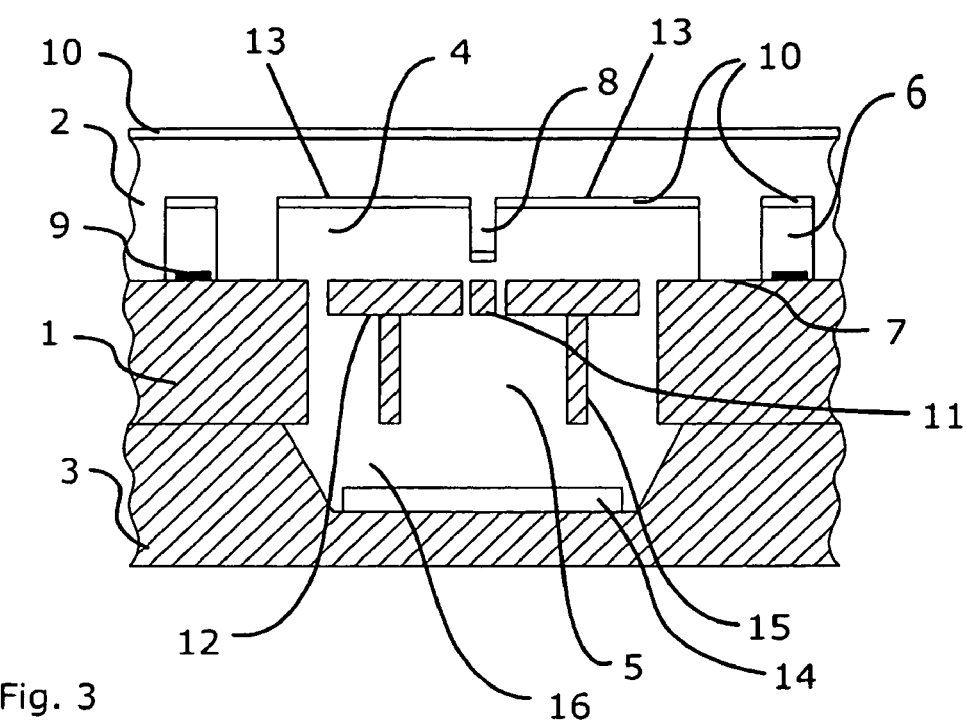

FIG. 3 shows a micromirror 12, which is suspended by torsion springs 11, which micromirror, produced by volume micromechanical process steps, is encapsulated by a transparent cap wafer 2 and a non-transparent cap wafer 3 having a recess.

Figure 4:
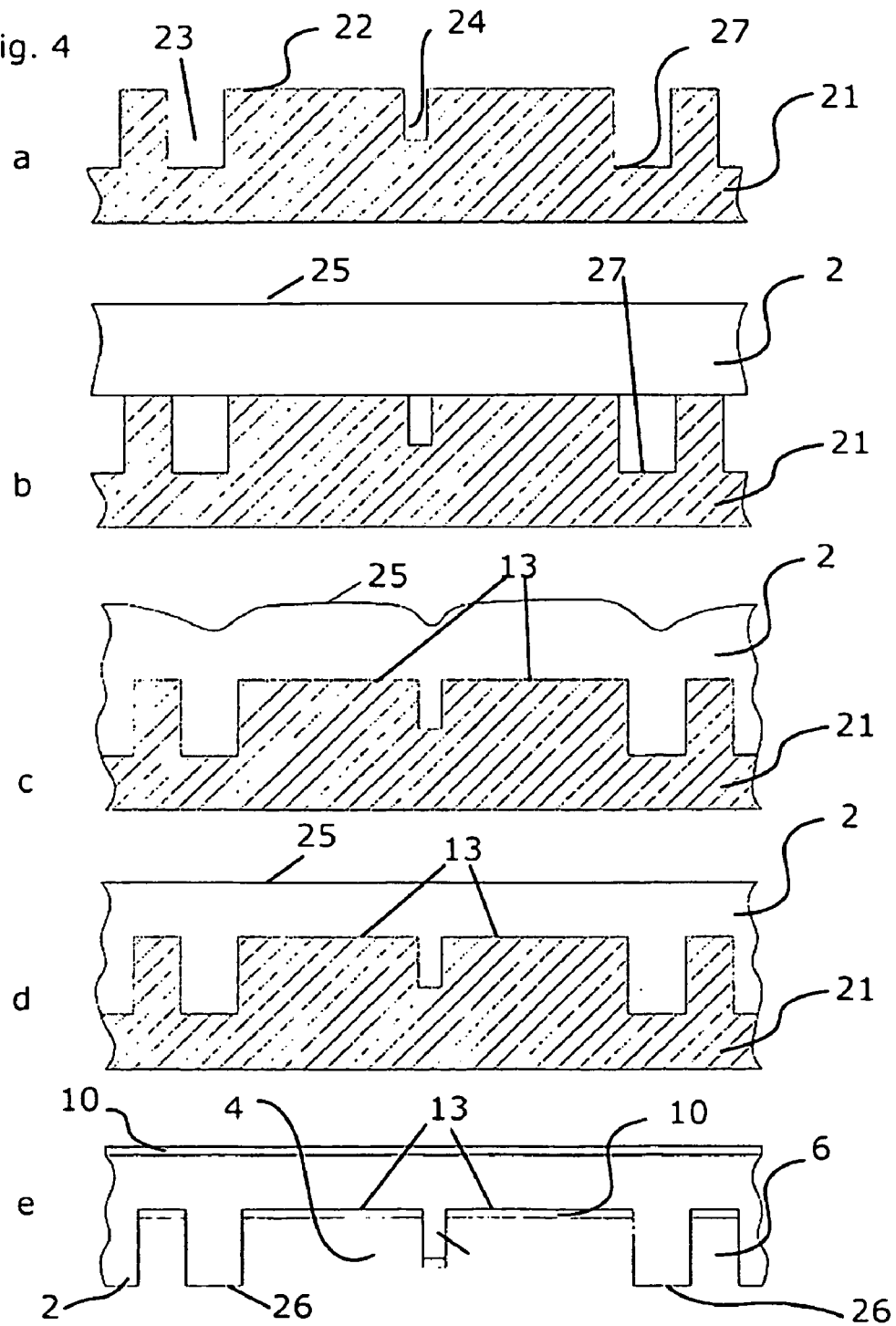

FIG. 4 shows the step sequence for producing a cap wafer 2 using the glass flow method.

FIG. 1 shows a cross-section of a silicon micromirror 12 suspended by torsion springs 11, which micromirror, produced by volume micromechanical process steps, is encapsulated by two transparent cap wafers made of borosilicate glass (top cap wafer 2 on the front of the supporting wafer and bottom cap wafer 3 on the back of the supporting wafer), with feedthroughs leading through the silicon supporting wafer 1. To guarantee a hermetically sealed housing, the supporting wafer 1 has been bonded on both sides by an anodic bonding process to the cap wafers 2, 3.

In addition, the supporting wafer 1 for the bonding with the cap wafers 2, 3 exhibits a frame-shaped sealed planar contact area 7 around the micromirror 12. The correspondingly sized frame-shaped sealed planar contact area 7 is provided as a mating contact area for the cap wafers.

The top cap wafer 2 contains recesses 4 that in connection with the supporting wafer 1 form the cavities 5 necessary for the movements of the micromirror.

The micromirror 12 suspended by torsion springs 11 can for example have a diameter of 10 mm. If such a micromirror 12 has a maximum tilt of 10°, recesses 4 in the top cap wafer 2 of over 870 μm are necessary so that the deepest recesses 4, measured from the contact areas 7 to the bottom of these recesses 4, are approximately 900 μm. The bottoms of the deepest recesses 4 at the same time form the areas functioning as optical windows 13.

For the mechanical stops 8 the depth of the recesses 4 is sized in such a way that the stops for the non-displaced torsion springs 11 exhibit a vertical distance between 1 μm and 50 μm. The stops 8 have no optical function. They afford only a mechanically protective functionality to the top cap wafer 2.

In the embodiment according to FIG. 1, the top cap wafer 2 therefore exhibits three different structure heights to create the optical windows 13, the stops 8, and the contact areas 7.

The optical windows 13 and the planar side of top cap wafer 2 facing away from the micromirror 12 have an anti-reflective coat 10 consisting of a magnesium fluoride and titanium dioxide coating system.

The bottom cap wafer 3 is not patterned and hermetically seals the cavity 5 around the micromirror 12. To allow optical functionality here as well, the bottom cap wafer 3 is also provided with anti-reflective coats 10 on both sides. This would make it possible for example to irradiate the back of the micromirror 12 as well and to use the reflected beam to determine the mirror's position.

Mechanical stops 8 are not present in the bottom cap wafer 3, but they can be provided in a further embodiment to ensure overload protection in both directions perpendicular to the supporting wafer level.

If the bottom cap wafer 3 does not have to perform any optical functionality, a commercially available silicon wafer can be used, as shown in FIG. 2 and FIG. 3.

As FIG. 3 likewise shows, in a further embodiment the bottom cap wafer 3 has a recess 16 to enlarge the cavity 5 around the micromirror 12. This is necessary when the micromirror 12, as in the embodiment depicted here, has reinforcement structures 15 to reduce static and dynamic deformations and/or drive structures 15, for example for vertical drives and/or at wafer thickness. In addition, the recess 16 in the bottom cap wafer 3 is used to deposit a getter material 14 (for example zirconium alloys, titanium), which is used to maintain a long-lasting vacuum within the cavity 5.

A further embodiment according to the present invention provides additional recesses 6 in the top cap wafer 2 outside the cavity 5 enclosing the micromirror 12 according to FIG. 1-3. After supporting wafer 1 and top cap wafer 2 are joined, these recesses 6 enclose the connector panels (pads) 9 of each chip. By suitably layering the supporting wafer 1, buried conductor paths under the contact area 7 can be guided between supporting wafer 1 and top cap wafer 2 out of the cavity 5 enclosing the micromirror 12 laterally to the connector panels 9. With a sawing step, which does not saw into the entire wafer compound made of supporting wafer 1 and cap wafers 2, 3 but rather only the top cap wafer 2 near the connector panels 9, one can render the connector panels 9 accessible without impairing the atmosphere in the cavity 5 enclosing the micromirror 12. The advantage of this is that for example functional tests or measurements of the finally encapsulated micromirror 12 can be carried out before dicing.

After the silicon supporting wafer 1 with the micromirror 12 to be encapsulated is provided, two borosilicate glass wafers for example are provided that serve as top cap wafer 2 and bottom cap wafer 3. The borosilicate glass wafers have for example a thickness of between 0.5 mm and 3 mm; depending, among other things, on the required stability.

FIG. 4 shows the step sequence for structuring the cap wafer 2 using the glass flow method. The structures of a patterned wafer 21 are molded or transferred onto the top cap wafer 2.

A silicon wafer polished on one side is the basis for the patterned wafer 21. This patterned wafer 21 remains unchanged in the areas by which the optical windows 13 are molded so that the original surface quality of the polished silicon wafer 21 is retained. In the areas in which the contact areas 7 of the top cap wafer 2 are produced, deep grooves 23 are uniformly etched into the patterned wafer 21. The etching depth of these grooves 23 approximately determines the depth of the cavity 5. Different etching methods are brought into consideration here. This can be achieved for example very homogenously over the entire patterned wafer 21 in a time-controlled manner by wet etching methods using potassium hydroxide (KOH) or TMAH (tetramethylammonium hydroxide). But plasma dry etching methods can also create such grooves 23 with great precision, provided in general that the width of the grooves 23 is uniform overall.

To maximize homogeneity of groove depth and at the same time to minimize roughness on the groove bottoms (27), an SOI wafer (silicon on insulator wafer) of equivalent thickness can be used for the patterned wafer 21 instead of the standard silicon wafer, the grooves 23 being etched up to the concealed oxide layer.

To create mechanical stops 8 within the optical windows 13, additional grooves 24 of lesser etching depth to be etched are necessary. FIG. 4a shows the completed patterned wafer 21.

In the next step, the top cap wafer 2 is anodically bonded to the patterned wafer 21 as shown by FIG. 4b. To completely mold the structures of the patterned wafer 21, it is generally necessary to carry out this bonding process in a vacuum.

Then the combination of patterned wafer 21 and top cap wafer 2 is heated in an oven to 600-800° C. The top cap wafer 2 then begins to melt and, as a result of the pressure difference between the vacuum in the grooves 23, 24 of the patterned wafer 21 and the greater ambient pressure in the oven, is pushed into the grooves 23, 24 of the patterned wafer 21 until the grooves 23, 24 of the patterned wafer 21 are completely filled with borosilicate glass of the top cap wafer 2. In this manner, the structures of the patterned wafer 21 are completely molded onto the top cap wafer 2.

Because of the glass flow, the side of the top cap wafer 2 facing away from the patterned wafer 21 is no longer planar after cooling (FIG. 4c) and must therefore be planarized and smoothed in a precise grinding and polishing process until optical quality is ultimately restored. The result of this step is shown in FIG. 4d.

In the next step, the polished top cap wafer 2 is released from the patterned wafer 21 in that the patterned wafer 21 is etched away by wet etching.

The bottom cap wafer 3 is planar on both sides or has a recess 16 on the side facing the supporting wafer.

In an advantageous embodiment of the method, anti-reflective coats 10 consisting of a magnesium fluoride and titanium oxide coating system are vapor-deposited onto the surfaces of the cap wafers 2,3, which have an optical function and which are parallel to the supporting wafer level after the bonding process. These anti-reflective coats 10 must then be removed from the content areas 7 (FIG. 4e) because the anti-reflective coats 10 could disturb the bonding process.

This removal is achieved by a polish that only acts on the contact area 7 but not the anti-reflective coats 10 in the recesses 4, 16.

The cap wafers 2, 3 are then bonded to the supporting wafer 1.

List of References

1 Supporting wafer
2 Top cap wafer
3 Bottom cap wafer
4 Recesses in the top cap wafer
5 Cavity
6 Recesses for the connector panels (pads)
7 Contact area between supporting wafer and top cap wafer
8 Mechanical stop
9 Connector panels (pads)
10 Anti-reflective coat
11 Torsion springs
12 Micromirror
13 Optical window
14 Getter material
15 Reinforcement and/or drive structure
16 Recess in the bottom cap wafer
21 Patterned wafer
22 Polished surface for the optical windows
23 Grooves for contact area
24 Grooves for stop
25 Back of the top cap wafer
26 Contact area of the top cap wafer
27 Groove bottom for contact area between supporting wafer and top cap wafer

The invention claimed is:

1. Housing for one or more microcomponents (12), exhibiting a supporting substrate (1), having at least one microcomponent (12), and at least one cap substrate (2, 3), which is joined to the supporting substrate (1)—wherein by means of the supporting substrate (1) and the at least one cap substrate (2) at least one cavity (5) is formed that includes at least partially the at least one microcomponent (12)—and the side of which cap substrate facing the at least one microcomponent (12) exhibits an optical window (13) and a mechanical stop (8) characterized in that the mechanical stop (8) is integral with the cap substrate (2,3) and the optical window (13) exhibits an evenness and/or plane parallelism deviation of less than or equal to 3.75 µm.

2. Housing according to claim 1 characterized in that the mechanical stop (8) protrudes from said side of the cap substrate facing the at least one microcomponent (12).

3. Housing according to claim 1 characterized in that the at least one cap substrate (2, 3) exhibits at least one recess (4) that is deeper than 900 µm.

4. Housing according to claim 1 characterized in that the at least one cap substrate (2, 3) contains glass and/or another vitroid at least in parts.

5. Housing according to claim 4 characterized in that the glass is a silicate glass.

6. Housing according to claim 5 characterized in that the silicate glass is a borosilicate glass.

7. Housing according to claim 1 characterized in that the optical window (13) exhibits an evenness and/or plane parallelism deviation of less than or equal to 180 nm.

8. Housing according to claim 1 characterized in that the optical window (13) exhibits a root-mean-square roughness of less than or equal to 15 nm.

9. Housing according to claim 8 characterized in that the optical window (13) exhibits a root-mean-square roughness of less than or equal to 5 nm.

10. Method for producing a housing for one or more microcomponents (12), exhibiting a supporting substrate (1), having at least one microcomponent (12), and at least one cap substrate (2, 3), which is joined to the supporting substrate (1)—wherein by means of the supporting substrate (1) and the at least one cap substrate (2) at least one cavity (5) is formed that includes at least partially the at least one microcomponent (12)—and the side of which cap substrate facing the at least one microcomponent (12) exhibits an optical window (13) and a mechanical stop (8), said method comprising the following steps:

providing said supporting substrate (1) having at least one microcomponent (12)

providing said at least one cap substrate (2,3) patterned using a glass flow method, joining said supporting substrate (1) to said at least one cap substrate (2,3) so that the supporting substrate (1) and the at least one cap substrate (2,3) form said at least one cavity (5) that encloses said at least one microcomponent (12) at least partially.

11. Method according to claim 10 characterized in that the supporting substrate (1) is joined to the at least one cap substrate (2,3) at a pressure lower than the atmospheric pressure.

12. Method according to claim 10 characterized in that the supporting substrate (1) is joined to the at least one cap substrate (2,3) in an inert gas atmosphere.

13. Method according to claim 12 characterized in that the inert gas atmosphere contains or consists of argon.

* * * * *